United States Patent [19]

Bernstein

[11] Patent Number: 4,727,267
[45] Date of Patent: Feb. 23, 1988

[54] CLOCKED BUFFER CIRCUIT

[75] Inventor: Kerry Bernstein, South Burlington, Vt.

[73] Assignee: International Business Machines Corporation, Armonk, N.Y.

[21] Appl. No.: 62,036

[22] Filed: Jun. 15, 1987

Related U.S. Application Data

[60] Continuation of Ser. No. 851,192, Apr. 14, 1986, abandoned, which is a division of Ser. No. 499,730, May 31, 1983, Pat. No. 4,558,433.

[51] Int. Cl.$^4$ .......................................... H03K 19/094
[52] U.S. Cl. .................................. 307/443; 307/448; 307/453; 307/449; 365/230
[58] Field of Search ............... 307/443, 449, 463, 475, 307/279, 291, 452–453, 480–481, 448; 365/230; 340/804, 825.5, 825.52, 825.53

[56] References Cited

U.S. PATENT DOCUMENTS

| | | | |
|---|---|---|---|
| 3,902,082 | 8/1975 | Proebsting et al. | 365/230 X |
| 3,940,747 | 2/1976 | Kuo et al. | 307/449 X |
| 3,942,160 | 3/1976 | Yu | 365/230 X |
| 4,057,787 | 11/1977 | Heuner et al. | 307/449 X |

Primary Examiner—Stanley D. Miller
Assistant Examiner—D. R. Hudspeth
Attorney, Agent, or Firm—Francis J. Thornton

[57] ABSTRACT

The present invention is especially directed towards an improved clocked buffer circuit that will clock, decode, repeat and invert an input signal. The clocked buffer circuit uses a clocked latch coupled to a decode circuit such that not only will the applied clock signal control the decode circuit, but the output of the latch will also control the decode circuit thus assuring the output of the decode circuit becomes latched into the set by the input clock signal.

9 Claims, 9 Drawing Figures

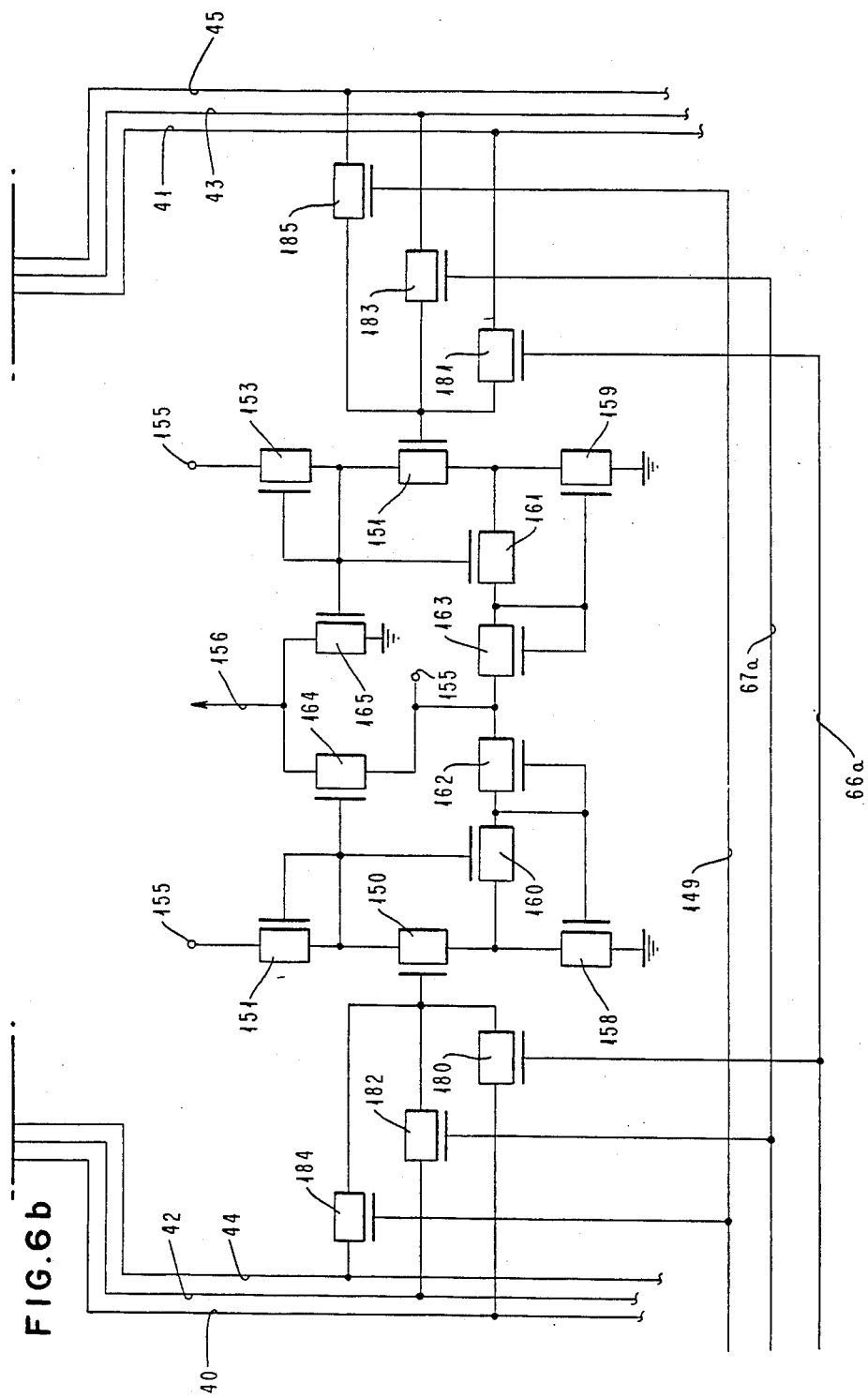

CLOCKED BUFFER CIRCUIT

This application is a continuation of application Ser. No. 851,192, filed Apr. 14, 1987, and now abandoned, which is a division of application Ser. No. 499,730, filed May 31, 1983 and now U.S. Pat. No. 4,558,433.

FIELD OF THE INVENTION

This invention relates to a random access read/write memory system and, more particularly, to a multiple read/write system having improved support circuitry for reading such a system.

BACKGROUND OF THE INVENTION

In selected micro-processors, some of which require high speed registers as local storage, it would be desirable if each register can be separately addressable from a multiplicity of data-in ports for a write and separately addressable to a multiplicity of data-out ports for a read. The data, in the register, thus would be addressable at any data-in port and readable at any data-out port. Such multi-port devices might comprise, for example, three bit memory configurations, arranged with independent read and write addressing, so that upon a write, the identical information is written into each configuration, in the identical address position, and then sequential writes will write into the different port addresses, in parallel, so that each of the three configurations contain the same information in the same address positions, then a simultaneous read of the three configurations in three different positions—three different addresses—will present three different words to each of the three different out ports. When an attempt is made to merge the information and read it from a single configuration, problems arise. One such problem, with such arrangements, is that there is no restriction which prohibits all three read heads from trying to read data from the same cell at the same time. Since some of the cells must be significantly larger because of the simultaneous read, the cell size and the array size is double or triple; thus, such multi-port circuits have generally been avoided, for until recently, there has been no satisfactory way of preventing multiple reads in a single cell while delivering that cell data to each port with a multiple read.

RELATED INVENTIONS

Co-pending applications by Anatol Furman, relating to Multi-Port Register Implementations, now U.S. Pat. No. 4,535,428 and U.S. Pat. No. 4,554,645 both filed Mar. 10, 1983, and assigned to the same assignee as the present invention disclose a basic multi-port system.

BACKGROUND ART

In U.S. Pat. No. 3,896,417 to D. Beecham, there is disclosed an arrangement whereby a plurality of shift registers is arranged together with a comparator to compare the rotational positions of an input write ring counter and an input read ring counter so that when a matched signal is developed, the write counter is disabled.

In U.S. Pat. No. 4,183,095 to W. P. Ward, there is described a high density memory system that uses serially reading and writing data from and into selected memory elements by using a comparator to control the operating mode of the memory system. Thus, the read and write mode is selected by comparing the signal on a clock conductor.

Finally, in U.S. Pat. No. 4,078,261 to M. S. Millhollan et al, there is described a system in which read circuitry is disabled during a write cycle.

SUMMARY OF THE INVENTION

The present invention is especially directed towards an improved support circuitry for a memory array which utilizes support circuitry in a memory array such that, when an address compare occurs, selected ones of the array word decoders are disabled to prevent a multiple read, and selected higher order read heads are altered, i.e., inhibited from reading the output data of the higher order bit lines and forced to read or copy the lowest order bit lines having the same address as the uninhibited word decoder.

From the foregoing, it can be seen that one object of the present invention is to provide an improved support circuitry for reading multi-port memory systems.

Another object of the present invention is to provide an inhibit and copy circuit for multi-port memory systems which is extendable to any size system and which results in better power performance as well as a smaller size.

These and other objects of the present invention will become more apparent when taken in conjunction with the following descriptions and drawings wherein there is set forth a specific embodiment of the present invention.

BRIEF DESCRIPTION OF THE DRAWINGS

FIGS. 6a and 6b illustrate the preferred embodiment of the read heads and their associated inhibit and copy circuitry.

DESCRIPTION OF THE PREFERRED EMBODIMENT

A multi-port register stack is intrinsic to selected micro-processors, some of which require 16 high speed registers as local storage. Each register is required to be at least 32 bit long, (any may be even longer if parity is required), for the 32 bit processor. Thus, it is convenient to consider the register stack as a 512 bit static memory with 16 words of 32 bits each; where every read or write is a 32 bit wide word.

The term "multi-port" as used herein refers to the requirement that each register must be separately addressable from a multiplicity of data-in ports (for a write), or each register must be separately addressable to a multiplicity of data-out ports (for a read). The term "port" refers to the number of ways that a given register (or bit in a register) may be addressed; but (addressable) from any port.

To more clearly demonstrate the action of a multi-port register stack, consider the following implementation of a multi-port register stack which requires three reads. Three single port 512 bit memories with independent read and write addressing are arranged so that on a write, the identical information is written into each memory in the identical addressed position. Then, sequential writes will write the same information into each memory into the different port addresses in parallel, so that each of the three memories contains the same information in the same address positions. Finally, a simultaneous read of the three memories in three different addresses will present three different words to each of the three different output ports.

Figure 1:
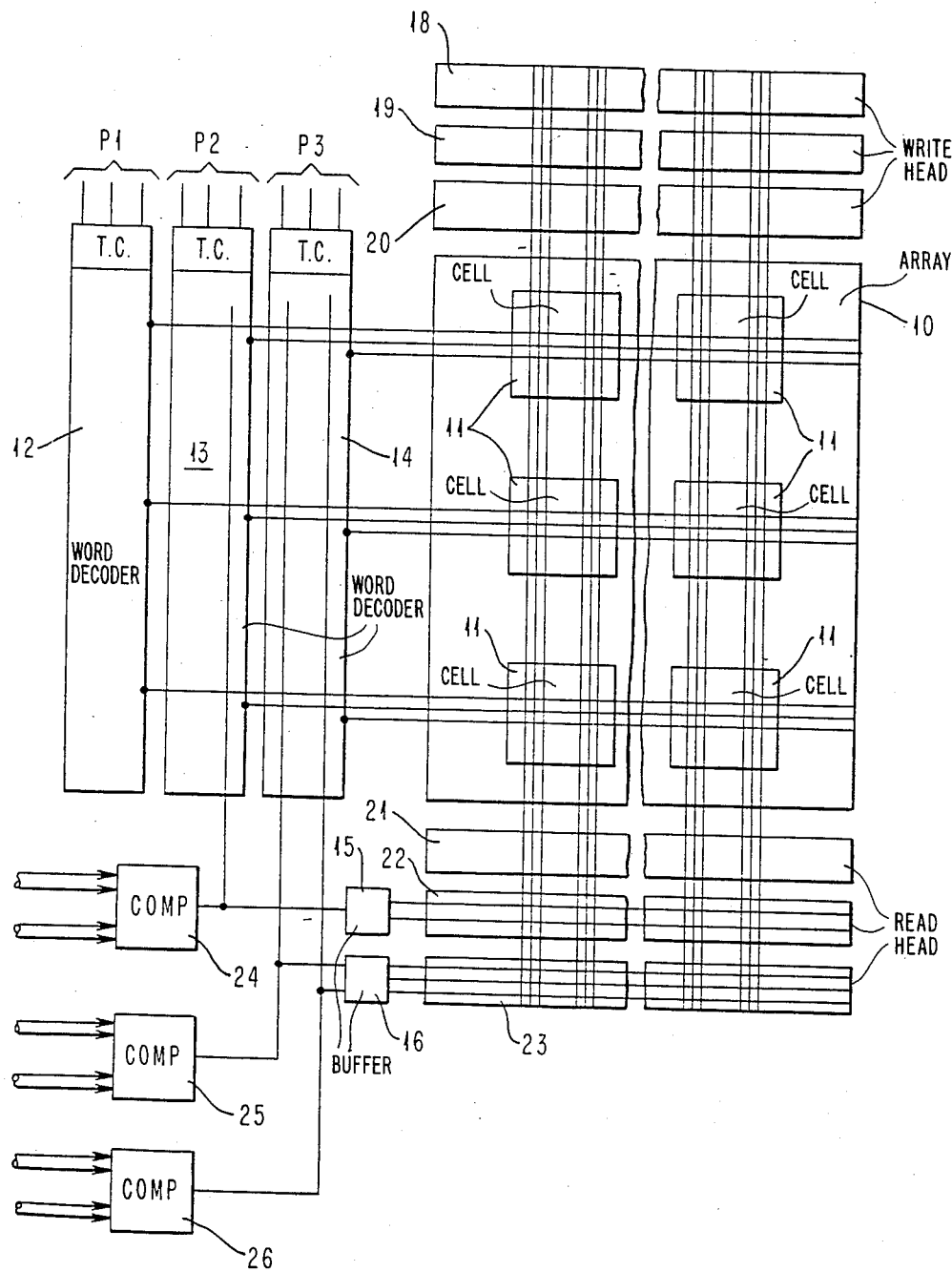
FIG. 1 illustrates in block schematic form a complete array of the system employing the present invention.
Figure 2A:
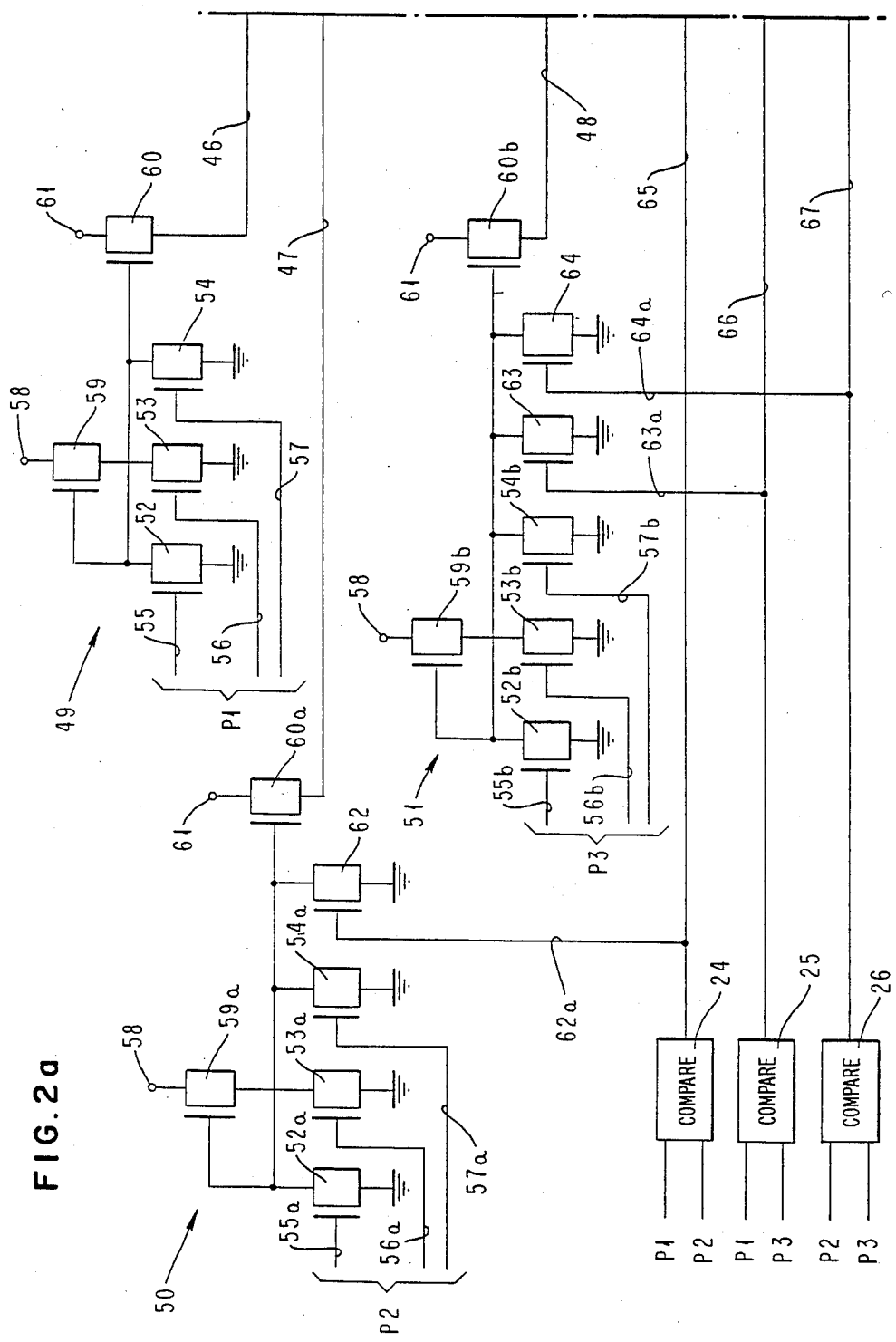
FIGS. 2a and 2b illustrate the array of FIG. 1 with typical detailed circuits for the word decoders and one of the cells of the array.
Figure 2B:
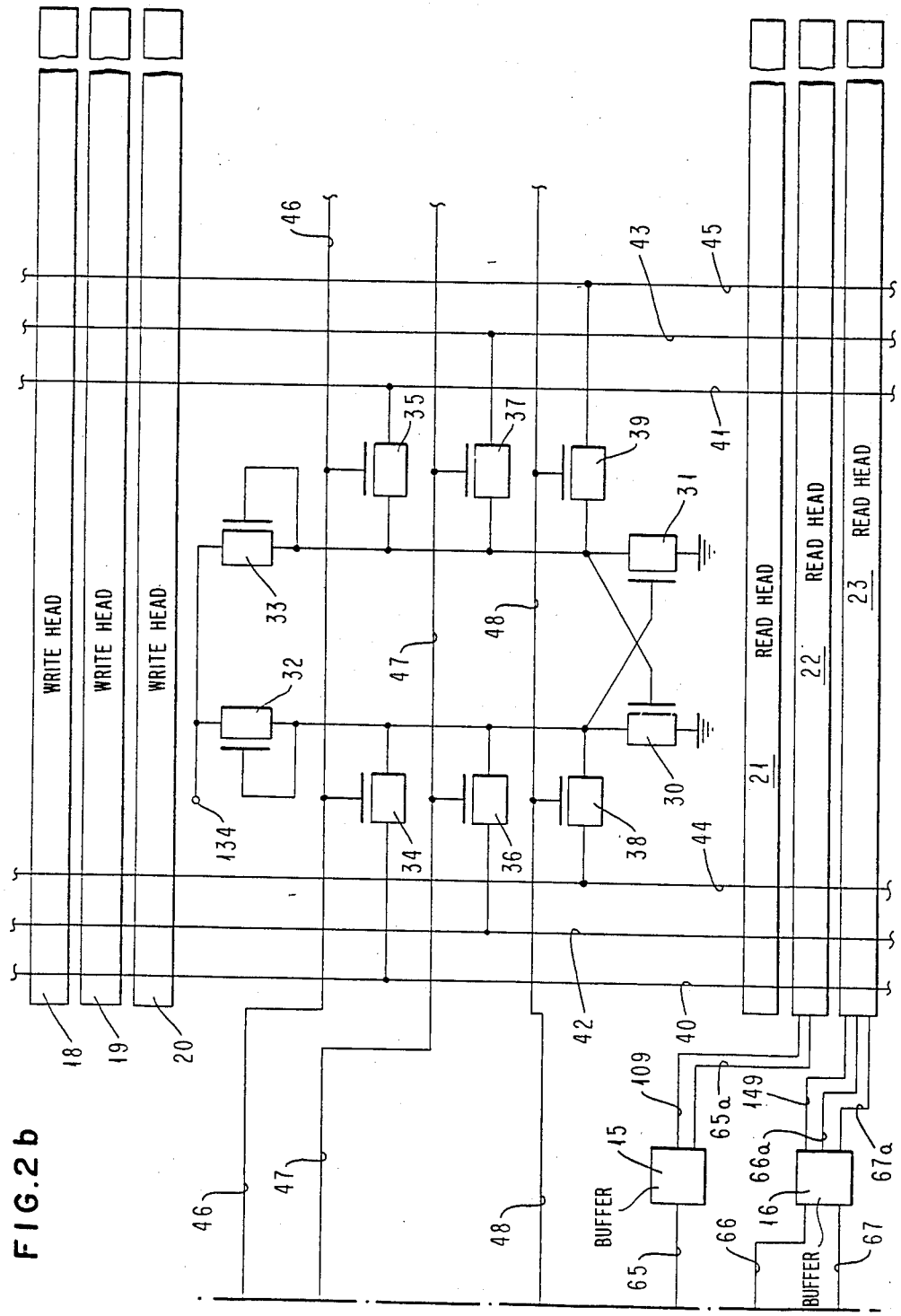

The present implementation is especially exemplified in FIGS. 1, 2a and 2b. Referring now to FIG. 1 of the drawing, there is shown a block diagram of a multi-port memory system employing the present invention.

The system has an array 10 of storage cells 11, each cell of which is coupled to a set of word lines and a set of differential bit lines. Each set of word lines and each set of differential bit lines is equal in number to the number of ports in the system. For purposes of example only, a three-port system will be described. In this case, each cell is coupled to three word lines, and six bit lines, i.e., three pairs of differential bit lines arranged orthogonal to the word lines. The word lines are coupled to the three respective sets of word decoders 12, 13 and 14 driven by respective sets of input address lines P1, P2 and P3. Thus, FIG. 1 shows unit cells 11 (each one bit) of a three port (three read and three write ports). If the cell 11 is replicated 32 times horizontally, (only two are shown in the figure) it represents one word of the register stack. Replicated 16 times vertically, (only three are shown in the figure) it represents one bit of the register stack.

As shown in FIGS. 2a and 2b, transistors 30, 31, 32 and 33 constitute the memory cell or latch, while transistors 34 and 35 differentially couple the bit lines 40 and 41 to the cell for reads and writes. This is basically the well known, classic six device cell.

Transistors 36, 37, 38 and 39 constitute the bit line coupling for the additional two ports, i.e., the additional two pairs of bit lines. Each cell is selected by one of three word lines 46, 47, 48 and read from or written into by its corresponding bit line pair. Two other cells in two other register words aligned vertically under this cell are also selected by their word lines, and read or written onto their respective bit line pairs from their respective ports.

Until very recently there was no restriction to prohibit all three ports from trying to read data from the same cell at the same time. To sink all of the current that the bit line coupling devices can deliver without changing state, transistors 30 and 31 must be large. That is, they must not permit data to be lost on a multiple read disturb. If three simultaneous reads are permitted in the same cell, then transistors 30 and 31 need be three times as large as if only one read is permitted to occur in that cell, but increasing their size three-fold represents a doubling of the cell size, and thus the array size.

The present invention corrects all these problems and comprises adding circuits to inhibit the address decoders while simultaneously transferring data from the lower order selected bit lines onto the other higher order selected bit lines and thence into the output ports of other read heads. In this implementation, the additional circuitry permits faster performance.

The bit lines are coupled to suitable write heads 18, 19 and 20 and to three read heads 21, 22 and 23 of which read heads 22 and 23 also are coupled to inhibit and copy circuits such read and write heads are described in U.S. Pat. No. 4,535,428 and U.S. Pat. No. 4,554,645. Those heads 22 and 23 which are coupled to inhibit and copy circuits are referred to as higher order circuits, with head 23 being a higher order than head 22, which, in turn, is a higher order than head 21. Similarly, these write decoders coupled to the address comparator circuits 24, 25 and 26 are referred to as higher order circuits; with decoder 14 being of a higher order than decoder 13, which is, in turn, of a higher order than decoder 12. There is also provided in accordance with the present invention three comparator circuits 24, 25 and 26, each of which are coupled to selective sets of the word decoder input address lines, to one or another of the high order word decoders 13 and 14, and to one or the other of the high order read heads 22 and 23, for comparing the address inputs to the word decoders, and, in the event of a compare, altering the output of the selected higher order word decoders to force it to conform to the selected order read heads having the same address. In this way, the output data from the cell is transmitted via all addressed output read heads without increasing the current flow through the cell.

FIGS. 2a and 2b illustrate in greater detail one of the cells 11 and its associated word decoders.

The cell 11 comprises a pair of cross coupled transistors 30 and 31 having their sources coupled to ground and their drains coupled through respective transistor loads 32 and 33 to a voltage source 134. The drains of the transistors 30 and 31 are also coupled through respective bit line transistors to respective bit lines. Thus, the drain of transistor 30 is coupled through bit line transistors 34, 36 and 38 to respective bit lines 40, 42 and 44 while the drain of transistor 31 is connected through bit line transistors 35, 37 and 39 to respective bit lines 41, 43 and 45.

The operation of such cross coupled cells is well known to the art and need not be described here. However, the operation of the cell basically depends upon the state of the transistors of 30 and 31 such that a differential signal is set up on the bit line pairs attached to the particular cell. Thus, for example, if the transistor 30 is off and the transistor 31 is turned on then the active bit lines coupled to the transistor 30 would be held high and the active bit lines coupled to the transistor 31 would be pulled low, thus setting up a differential voltage on each of the three pair of bit lines 40, 41; 42, 43; and 44, 45 which may be coupled to the cell through an active bit line transistor. The differential voltage on the selected bit lines can be read, at any time after a write, by suitable read heads 21, 22 and 23. This system, therefore, uses a time-multiplex read and write. This is, the read and write operations are sequential and not simultaneous.

It, of course, should be understood that although the described embodiment is so limited the invention is not so limited and can be applied to simultaneous read/write operations.

The gates of the bit line transistors are connected in pairs 34, 35; 36, 37; and 38, 39; to respective word lines 46, 47 and 48. Thus, the gates of transistors 34 and 35 are connected to word line 46. The gates of bit line transistors 36 and 37 are connected to the word line 47 and the gates of bit line transistors 38 and 39 are connected to the word line 48.

These word lines are in turn coupled to a respective one of the selected word decoders 49, 50 and 51. These word line decoders are, of course, just one of each of the sets of word decoders contained in the word decoders 12, 13 and 14 respectively. Each word decoder is basically comprised of a plurality of input decode transistors, each of which has its gate coupled to a respective address line. In this case it will be presumed, for purposes of explanation only, that three addresses are employed. Thus, decoder 49 comprises of three input decode transistors 52, 53 and 54 having their gates coupled to respective address lines 55, 56 and 57 which will be collectively referred to as address P1. The sources of the input transistors 52, 53 and 54 are coupled to ground and their drains are coupled to a voltage source 58, through a load 59, and are also coupled to the gate of a switching transistor 60 whose drain is coupled to a voltage source 61 and whose source is coupled to the word line 46.

Of course, it should be understood that if more than three addresses are required or used in the system, then additional input decode transistors equal to the number of input address lines would be used in such decoders.

Such word decoders generally operate as follows. If any one or all of the address lines 55, 56 and 57 has a positive signal thereon, say address line 55 is high, the device 52 is on causing the gate of device 60 to be grounded. Thus, the device 60 is off and the address line 46 is off. When all of the input addresses, lines 55, 56 and 57 are negative then the device 60 is on and the word line 46 is high since it is now coupled through device 60 to the voltage source 61. When the word line 46 is high the bit line devices 34 and 35 are on and information in the cell, i.e., the state of the cross coupled devices 31 and 32 is differentially received by the bit line pair 40 and 41 which are now coupled to the cell through the bit line devices 34 and 35.

The other decoders 50 and 51 are substantially identical to the decoder 49 and operate in identical fashion except that decoder 50 has one additional device 62 in parallel with the address decode devices 52a, 53a and 54a and decoder 51 has two additional devices 63 and 64 which are in parallel with the input address decode devices 52b, 53b and 54b. The gate of the additional device 62, in decoder 50, is coupled to the output of the first comparator circuit 24 while the gate of the first additional device 63, in decoder 51, is coupled to the output of the second comparator circuit 25 and the gate of the second additional device 64, in decoder 51, is coupled to the output of the third comparator circuit 26.

For the sake of convenience, the input address lines 55, 56 and 57, to decoder 49, will collectively be referred to as address set P1. The input decode address lines 55a, 56a and 57a, to the decoder 50, will collectively be referred to as address set P2 and the input address lines 55b, 56b and 57b, to the decoder 51, will be collectively referred to as address set P3.

These address lines, in addition to being coupled to respective decoders, are also coupled to respective ones of the comparator circuits 24, 25 and 26. Thus, for example, comparator circuit 24 has the address sets P1 and P2 introduced thereto while comparator 25 has the address sets P1 and P3 introduced thereto and comparator 26 has the address sets of P2 and P3 introduced thereto.

In these comparator circuits the address sets are compared and, if a comparison is found, a suitable and positive output signal is transmitted from the comparator. For example, a comparison between address sets P1 and P2 causes a positive signal to be presented on line 65 and transmitted from comparator 24 to the gate of the additional device in the decoder; in this case, device 62 in decoder 50, via line 62a. This positive signal causes device 62 to turn on and to deactivate the word line 47. This effectively disables the decoder 50 and prevents it from acting on input address set P2. Similarly, if a comparison appears between address sets P1 and P3, then a signal appears on lines 66 and 63a and device 63 in decoder 51 is turned on and the word line 48 is deactivated. Again, if the address sets P2 and P3 have a comparison a signal appears on lines 67 and 64a and device 64, also in decoder 51, is turned on, again the word line 48 would be deactivated. In this case, positive signs from either comparator 25 or 26 will effectively disable to decoder 51.

It should be noted that in some designs it may be preferable that the signal, on lines 62a, 63a, and 64a be clocked and buffered before being delivered to the gates of transistors 62, 63 and 64 to avoid any problems during, for example, read or write cycles.

Simultaneously, the output of the comparator circuits is transmitted to the higher order read heads, 22 and 23 via clocked buffer circuits 15 and 16 providing either an inverted or uninverted, i.e., a repeated signal to selectively set the inhibit and copy circuits to alter one or both of these higher order read heads 22 and 23 such that they copy the information from bit lines coupled to the lower order read head having the same address. Thus, the higher order read heads 22 and 23 receive either the true or the complement of the comparator circuits output. Read head 22 receives either the true or the complement of the output of comparator 24 while read head 23 receives either the true or the complement of the output of both comparators 25 and 26. For example, if only addresses P1 and P2 compare, then only the higher order read head 22 is altered to copy the information read by read head 21 and read heads 21 and 23 are unaffected. Similarly, if addresses P1 and P3 or addresses P2 and P3 compare, then only the higher order read head 23 is altered to copy the information on either read head 21 or read head 22 and read heads 21 and 22 are both unaffected. Finally, if all these addresses compare, both read heads 22 and 23 are altered to each copy the information read by read head 21 and only a single read head, i.e., head 21 is unaffected. Of course, it must be clearly understood that different addresses are directed to and activate different cells and that the only time a problem arises is when the cell is being addressed by two or more identical addresses.

Thus, the higher order read heads are prevented from trying to read data through the cell via the higher order bit line at the same time; devices 30 and 31 of cell 11 need not be enlarged since the current through the cell will not be excessive.

Figure 3:
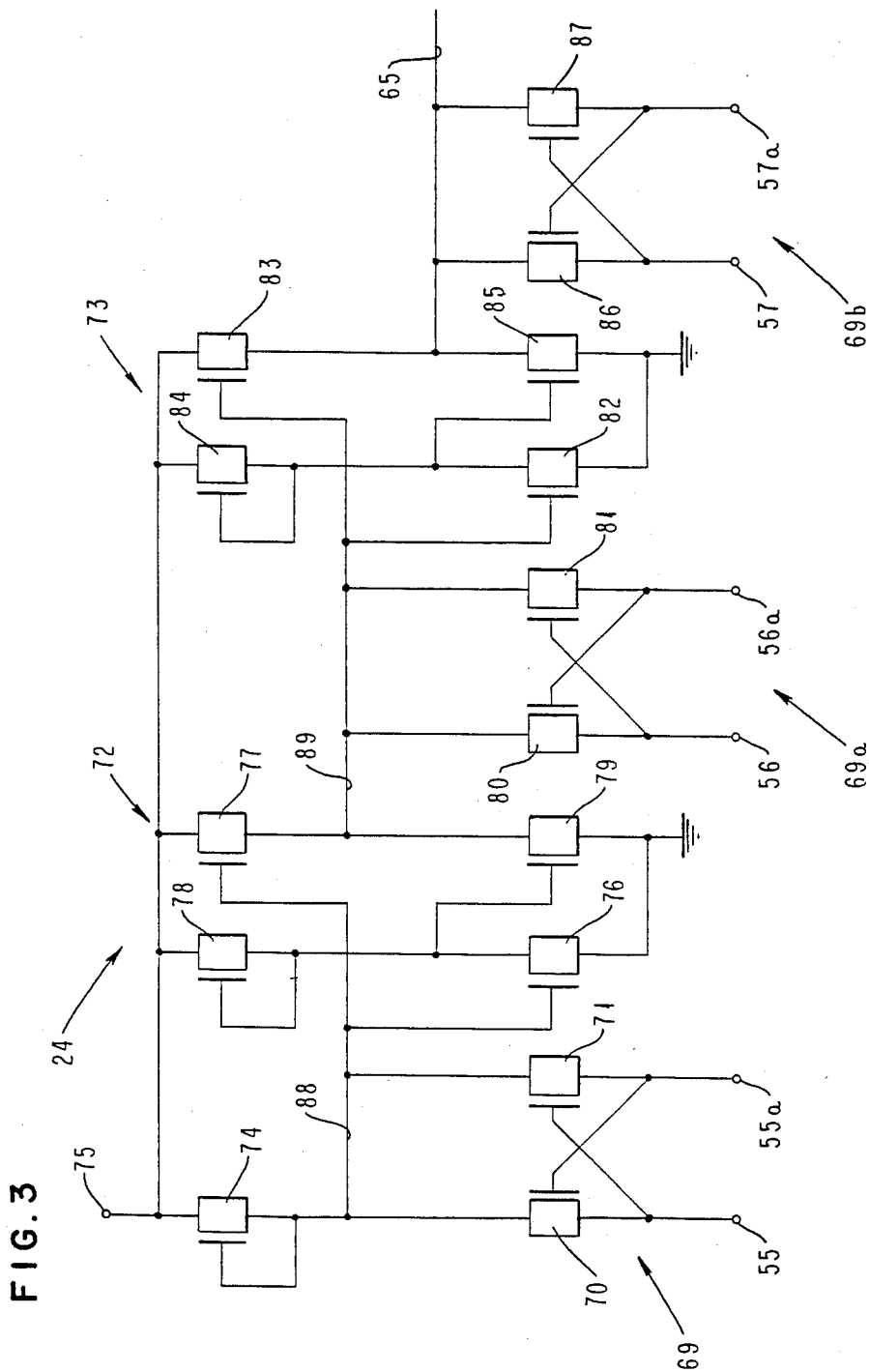
FIG. 3 illustrates the preferred embodiment of the comparator circuit of the invention as would be used in FIG. 1.

Turning now to FIG. 3, comparator circuit 24 will be described in greater detail as to its construction and operation.

FIG. 3 shows in detail the circuitry comprising the comparator circuit 24 of FIGS. 1, 2a and 2b. Basically, this comparator circuit 24 uses three serially arranged exclusive-ORs 69, 69a and 69b, alternated with common inverters 72 and 73 and with the final OR circuit 69b of the chain feeding line 65. The compares are implemented in low power logic preferably at the instruction address register where the addresses are stored. The net result is that only one read in a cell is guaranteed and the cell transistors 30 and 31 may be reduced in size by a factor of three. The bit lines become shorter and the bit line parasitic capacitance is significantly reduced such that the rise and fall times of the bit lines are correspondingly reduced.

As noted above the compare circuit 24 requires three exclusive-ORs 69, 69a and 69b, each of which does a bit-by-bit address compare. Thus address lines 55 of address set P1 and lines 55a of address set P2 feed into the first exclusive-OR circuit 69 via the sources of cross coupled transistors 70 and 71 whose drains are coupled together at node 88. This node 88 is coupled through a load transistor 74, to a voltage source 75 and to the gates of inverter transistors 76 and 77 of an inverter circuit 72 which also includes a load transistor 78 and a follower transistor 79. The source of transistor 76 is grounded and its drain is coupled through a second load transistor 78 to the voltage source 75. The drain of transistor 76 is also coupled to the gate of the follower transistor 79. The drain of transistor 79 is grounded and its source is connected through transistor 77 to voltage source 75 and to node 89.

The following exclusive-OR circuit 69a is, as shown in FIG. 3, substantially the same as circuit 69 except that different address lines 56, 56a are coupled into the sources of the cross coupled transistors 80 and 81 of this exclusive-OR. These transistors 80 and 81 have their drains coupled together at node 89 and from there to the following inverter circuit 73 whose output is coupled to the third and final exclusive-OR circuit 69b. Node 89 is coupled to the gates of transistors 82 and 83 with the source of transistor 83 grounded and its drain coupled through a load transistor 84 and to the gate of source follower transistor 85 whose drain is grounded and whose source is coupled through transistor 83 to the voltage source 83 and to the output line 65. This final exclusive-OR circuit 69b comprises a pair of cross coupled transistors 86 and 87 whose sources are coupled to address lines 57 and 57a respectively and whose drains are coupled to the output line 65. Circuit 69a is substantially identical to circuit 69 except that the input address lines are address lines 56 and 56a respectively. Similarly, the circuit 69b is also identical to circuits 69 and 69a except that its input lines are address lines 57 and 57a respectively. In this way, an address by address comparison is made between the P1 address inputs and the P2 address inputs. This comparator circuit performs the module ripple method when comparing two addresses of equal length. There is no clocking required since the circuit is fully static.

The following examples illustrate the operation of the circuit. We will first assume a first address set P2 comprising signals on lines 55, 56, 57 and a second address comprising signals on lines 55a, 56a and 57a are present and further assume that all signals are equal except for the signals on lines 56 and 56a, i.e., these signals differ from one another. In this case because the signals on lines 55 and 55a are equal transistors 70 and 71 remain off and the node 88 remains high due to the load transistor 74 and transistors 76 and 77 are conductive. With transistors 76 and 77 conductive transistor 79 is held off and its source tries to go high because transistor 77 is conductive. However, because the signals on lines 56 and 56a are different one of the cross coupled transistors 80 or 81 turns on pulling down the node 89 and holding the gates of transistors 82 and 83 low so that these devices remain off. With device 82 off the gate of device 85, due to load transistor 84, turns on pulling down line 65. With line 65 down no inhibiting and copy signal is sent to the the read head 22 via the clocked buffer circuit 15 and it operates in its normal manner.

In the event of a compare between address sets P1 and P2, i.e., when all the signals on lines 55, 55a, 56, 56a, 57, and 57a are identical, the circuit operates as follows. Because of the equal signals on lines 55 and 55a applied to the gates of transistors 70 and 71 they both remain off and the node 88 remains high due to the load transistor 82 causing transistors 76 and 77 to be conductive. With transistor 76 conductive transistor 79 is held off and node 88 goes high because transistor 77 is conductive. In this case the signals on lines 56 and 56a are identical and neither one of the cross coupled transistors 80 or 81 turn on and the node 89 remains high holding the gates of transistors 82 and 83 high so that these devices turn on holding device 85 off permitting line 65 to rise due to the action of the transistor 83. Line 65 remains high because transistors 86 and 87 also remain off due to the identity of two signals appearing on lines 57 and 57a. With line 65 high an inhibiting and copy signal is applied via buffer circuit 15, to an inhibit and copy circuit coupled to read head 22.

When the line 65 leading from the ripple comparator circuit is high indicating a compare the read head 22 is altered as will be described in conjunction with FIG. 4 and also the address decoder 50 is deactivated.

Comparator 25 is similarly arranged except that it compares the address set P1, introduced into address decoder 49, with the address set P3, introduced in address decoder 51, and its output line 66 feeds, via the buffer circuit 16, the inhibit and copy circuit associated with the read head 23, and also feeds line 63a leading to device 63 in the word decoder 51.

Comparator 26 is identical in construction to comparator circuits 24 and 25 except that it compares the address set P2, introduced to the word decoder 50, with these address set P3, introduced into the word decoder 51. Its output line 67 feeds the read head 23 through the buffer circuit 16, the inhibit and copy circuit associated with read head 23. Line 67 also leads to the inhibit line 64a leading to device 64 in the word decoder 51. A positive signal on either line 66 or 67 will cause a signal to be sent to the read head 23 and to the word line decoder 51.

Figure 4:
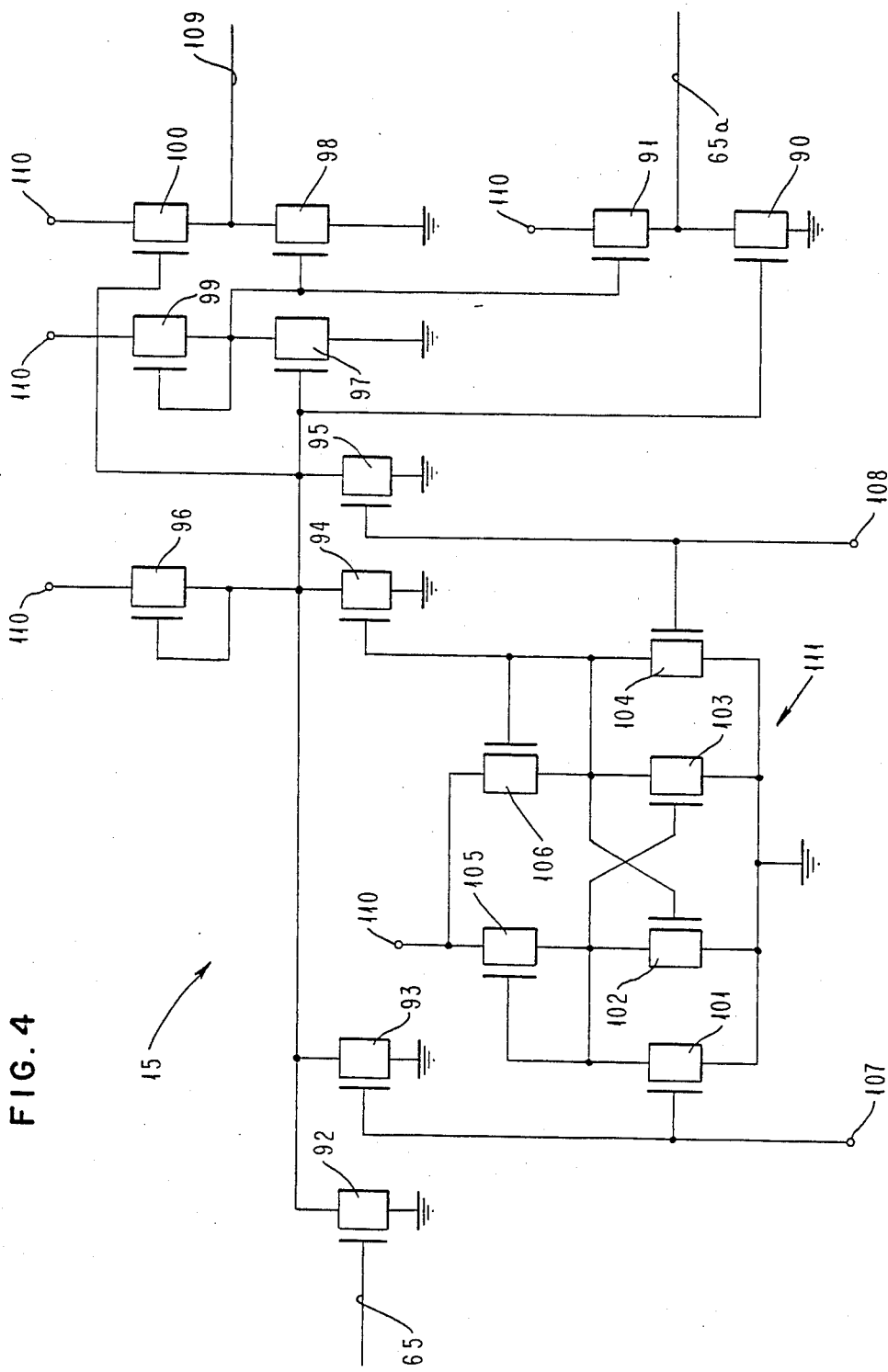
FIG. 4 illustrates a clock buffer circuit used in the present invention.
Figure 5A:
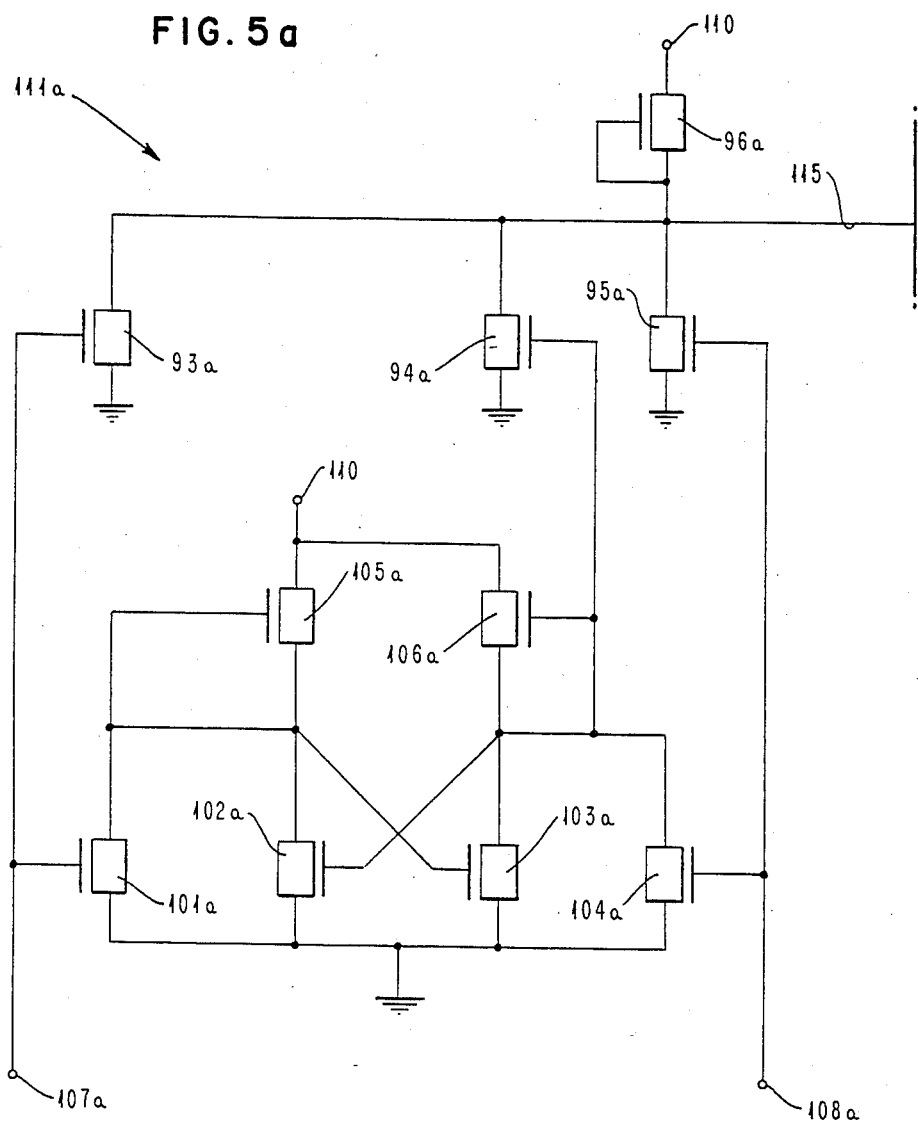
FIGS. 5a and 5b illustrate a different clock buffer circuit used in the present invention.
Figure 5B:
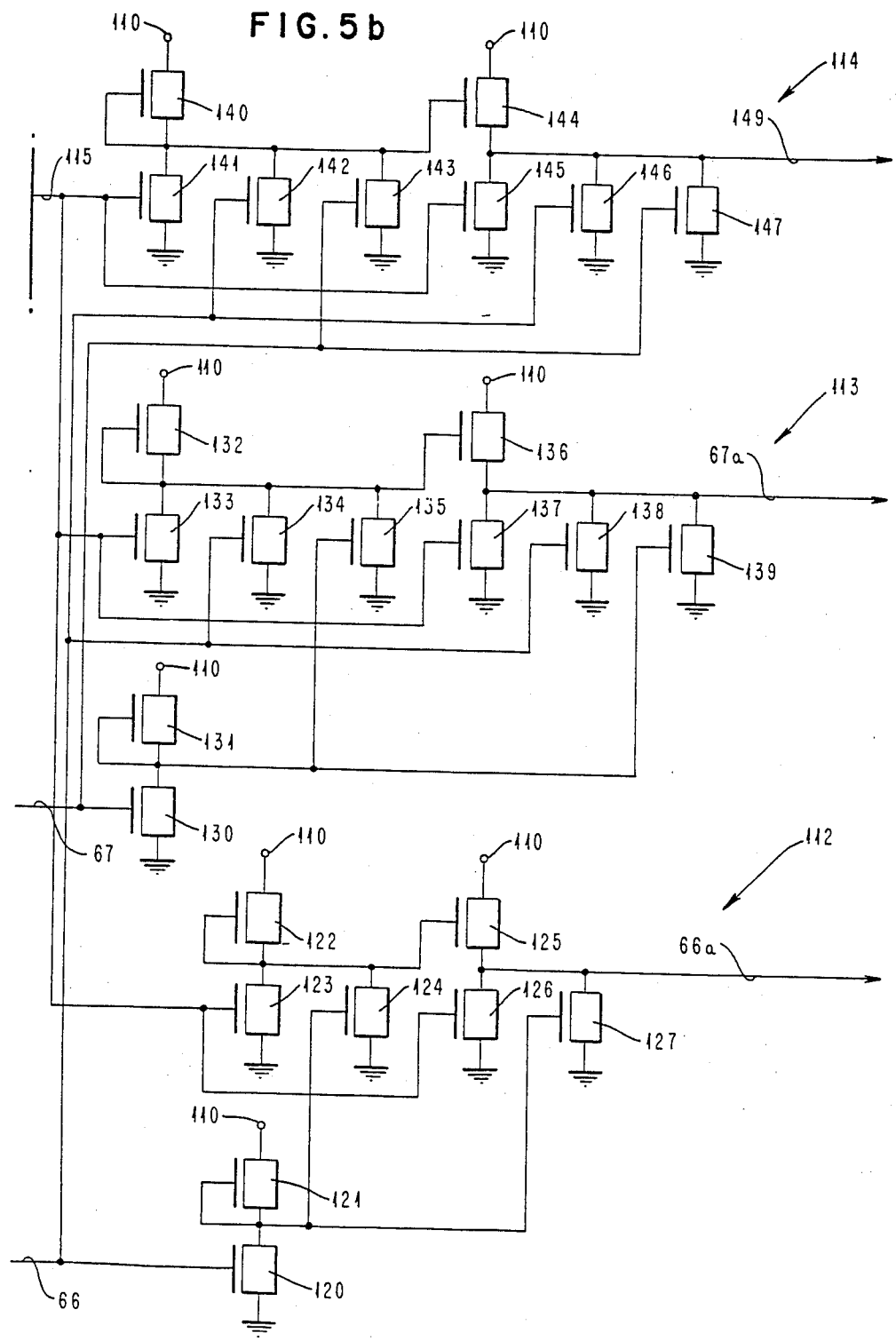

Turning now to FIGS. 4, 5a and 5b the clocked buffer circuit 15 and 16 will be described in detail.

These circuits are identical to each other in function in that they both clock, decode, repeat and invert the signal from respective compare circuits to which they are coupled to assure that the suitable signals are transmitted to the inhibit and copy circuits associated with the read heads 22 and 23 to assure that they operate in the desired manner at the desired time. For this reason only circit 15 will be described in detail.

The circuit 15, as shown in FIG. 4, receives a signal from compare circuit 24 on line 65. This line 65 is coupled to the gate of a first decode transistor 92 of a series of decode transistors 92, 93, 94, and 95. These decode transistors 92, 93, 94, and 95 all have their sources grounded and their drains coupled together and to the voltage source 110 through the load transistor 96 as well as to the gates of transistors 90, 97 and 100 which for want of a better name I call follower transistors. The follower transistors 90 and 97 have their sources grounded. The drain of transistor 97 is coupled through a load transistor 99 to source 110 and to the gates of control transistors 91 and 98. The drain of transistor 98 is coupled to the output line 109 and to the voltage source 110 through the follower transistor 100. The source of transistor 98 is grounded. The drain of transistor 91 is coupled to the voltage source 110. The source of transistor 91 is coupled to the output line 65a.

The gates of decode transistors 93 and 95 are respectively coupled to to clocked input lines 107 and 108 while the gate of transistor 94 is coupled to the output of a clocked latch 111. This latch 111 is formed with a pair of cross coupled transistors 102 and 103 whose sources are now grounded and whose drains are connected through respective load transistors 105 and 106 to voltage source 110. In parallel to the cross coupled transistors 102 and 103 are a pair of switching transistors 101 and 104 whose sources are grounded and whose drains are coupled through the respective load transistors 105 and 106 to voltage source 110. The drains of transistors 103 and 104 are also coupled to the set line of the latch which is coupled to the gate of decode transistor 94. The gates of the two switching transistors 101 and 104 are coupled to the clock input lines 107 and 108 respectively.

This clocked buffer circuit works as follows. The output line 109 is normally high and the output line 65a is normally low due to the fact that transistors 90, 97 and 100 are normally on while transistors 91 and 98 are normally off. Thus line 65a repeats the signal appearing on line 65 while line 109 displays the inverse of the signal on line 65. Transistors 97 and 99 thus form what I call, for want of a better name, a follower circuit and transistors 98 and 100 thus form what I call an inverter circuit and devices 90 and 91 form what I call, for a want of a better name, a repeater circuit. It is to be noted that these transistors 97 and 99 co-act with these two circuits. Thus, line 109 is held substantially at the level of the voltage source 110 via transistor 100 while line 65a is held low by transistor 90. Assume that both clock lines 107 and 108 do not have a signal thereon. When a compare signal is received on line 65 the gate of transistor 92 is pulled high and transistor 92 turns on. The gates of transistors 90, 97 and 100 coupled to the drain of transistor 92 fall and transistors 90, 97 and 100 turn off. When transistor 97 turns off it lets the gates of transistors 91 and 98 rise, via load transistor 99, turning on transistors 91 and 98 and causing the voltage on line 109 to be pulled down from its normally high state towards ground and permitting line 65a to be pulled up by voltage source 110 through transistor 91. Once the compare signal, received at the gate of transistor 92 which causes turning on of transistor 92 disappears the circuit tries to revert to its normal state and the line 109 tries to rise and the line 65 tries to fall.

Clock signals are applied sequentially to lines 107 and 108 to assure that lines 109 and 65a remain in their set condition for a specified period of time regardless of the existence of a compare signal on line 65. By providing clock pulses to the circuit the output line 109 can be forced to remain in its set low state and the output line 65a can be forced to remain in its set high condition for a predetermined period of time. This is accomplished by applying spaced positive clock signals to the lines 107 and 108. If we assume clock line 107 rises first then it causes transistor 93 to turn on and pull down the gates of transistors 90, 97 and 100. These gates remain down for the duration of the clock signal even if the compare input signal on line 65 terminates. Simultaneously the clock pulse on line 107 causes the transistor 101 to turn on pulling down the gate of cross coupled transistor 103 turning off transistor 103. When transistor 103 turns off the gate of transistor 102 rises turning on transistor 102 and latching the gate of transistor 103 low. When transistor 103 turns off the output of the latch 111 rises and transistor 94 turns on. The latch 111 now remains in this state after line 107 returns to a low state, and until a positive clock signal appears on line 108. When a suitable timing signal is applied to line 108 it causes transistors 95 and 104 to turn on. When transistor 104 turns on the gates of transistors 94 and 102 are pulled down turning transistors 94 and 102 off. When transistor 102 turns off the gate of transistor 103 turns on and continues to hold both the gate of transistors 102 and 94 low. When the timing pulse on line 108 terminates, the transistor 95 turns off. With transistors 92, 93, 94 and 95 shut off, the line 109 rises as the transistors 97 and 100 turn on. When the latch is off and no clock pulses are on either lines 107 or 108 line 109 is controlled solely by device 92, whose gate is driven by line 65. Thus, the output on line 109 is an inverted state of the signal on line 65.

It should be noted that the particular timing pulses and their sequences depends upon the architecture of the system and the whims of the designer. For example, if desired, buffer circuits can be provided with additional inverter circuits if necessary to change the normal and set conditions of line 109 and 65a.

The circuit 16, as shown in FIGS. 5a and 5b, receives signals from both compare circuits 25 and 26 on lines 66 and 67 respectively as well as from a clock circuit 111a. To provide the necessary outputs the lines 66 and 67 and the clock circuit 111a are coupled to a plurality of decode circuits 112, 113 and 114. The line 66 is coupled to the gates of an inverter transistor 120 in circuit 112 and to decode transistors 134, and 138 in circuit 113 and to decode transistors 142 and 146 in circuit 114. The line 67 is coupled to an inverter transistor 130 in circuit 113 and to the gate of decode transistors 143 and 147 in circuit 114.

The gates of decode transistors 123 and 126 of circuit 112, 133 and 137 of circuit 113 and, 141 and 147 of circuit 114 are respectively coupled to a clocked latch 111a. This latch 111a is identical to the clocked latch 111 of FIG. 4 and is formed with a pair of cross coupled transistors 102a and 103a whose sources are now grounded and whose drains are connected through respective load transistors 105a and 106a to voltage source 110. In parallel to the cross coupled transistors 102a and 103a are a pair of switching transistors 101a and 104a whose sources are grounded and whose drains are coupled through the respective load transistors 105a and 106a to voltage source 110. The drains of transistors 103a and 104a are also coupled to the set line of the latch which is coupled to the gate of decode transistor 94a. The gates of the two switching transistors 101a and 104a are coupled to the clock input lines 107a and 108a respectively.

This latch circuit works as follows. Its output line 115 is normally high due to the fact that transistors 93a, 94a and 95a are normally off. Thus line 115 is held substantially at the level of the voltage source 110 via transistor 96a until a clock pulse is received on clock lines 107a or 108a.

When clock signals are applied sequentially to lines 107a and 108a they assure that line 115 remains in its set low condition for a specified period of time. By providing clock pulses to the circuit the output line 115 can be forced to remain in its set low state and the decode circuits 112, 113 and 114 are controlled only by the lines 66 or 67. This is accomplished by applying spaced positive clock signals to the lines 107a and 108a. If we assume clock line 107a rises first then it causes transistor 93a to turn on and pull down line 115 and hold it down for the duration of the clock signal. Simultaneously the clock pulse on line 107a causes the transistor 101a to turn on pulling down the gate of cross coupled transistor 103a turning off transistor 103a. When transistor 103a turns off the gate of transistor 102a rises turning on transistor 102a and setting the gate of transistor 103a low. When transistor 103a turns off the set line of the latch 111a rises and transistor 94a turns on. The latch 111a now remains in this state after line 107a returns to a low state, and until a positive clock signal appears on line 108a. When a suitable timing signal is applied to line 108a it causes transistors 95a and 104a to turn on. When transistor 104a turns on the gates of transistors 94a and 102a are pulled down turning transistors 94 and 102 off. When transistor 102a turns off the gate of transistor 103a turns on and continues to hold both the gate of transistor 102a and the output line of the circuit 111a low. When the timing pulse on line 108a terminates; the transistor 95a turns off. With transistors 93a, 94a and 95a shut off, the output line 115 rises. When the latch is off and no clock pulses are on either lines 107a or 108a the decode circuits 112, 113 and 114 are controlled solely by lines 66 or 67.

If we now assume, for example, that line 66 is positive then the inverter transistor 120 and circuit 112 is on as is the decode transistors 134 and 138 of circuit 13 and transistors 142 and 146 of circuit 114. When inverter transistor 120 and circuit 112 turns on it causes transistors 124 and 127 to turn off. Since we assume at this time that no clock pulses have been received on line 115 transistors 123 and 127 are in their normally off position. This causes the gate of transistor 125 to rise through the load transistor 122. When the gate of transistor 125 rises it turns on causing the output line 66a to also rise. In this way the output read head 66a and 66 provide a single pulse to the inhibit and copy circuits in line 23. Simultaneously, of course, since transistors 134 and 138 are turned on by line 66 then the output line 67a is caused to be grounded and the output line 67a is deliberately kept low. Once again, simultaneously the transistors 142 and 146 are also turned on bringing the line 149 down. Thus an input signal on line 66 provides a positive output signal on line 66a and low signals on both line 67a and 149.

Now, however if line 67 rises while 66 is low then transistor 130 becomes turned on which in turn causes transistors 135 and 139 to be turned off. When transistors 135 and 139 turn off the line 67a rises due to the action of transistors 132 and 136 and a positive output pulse is realized on line 67a. Similarly because the pulse on line 67 is also received at the gate of transistors 143 and 147 and line 149 is brought low through transistors 143 and 147.

If, however, both lines 66 and 67 rise to have the copy and transfer circuits of read head 23 operate properly it is necessary that only one line 66a rise. In fact, it would be counterproductive to the invention if both lines 66s and 67s rose simultaneously. It is for this reason that the line 66 is coupled to the gates of transistors 134 and 138 to assure positively that line 67a is held low whenever line 66 rises.

Each of the circuits 112, 113 and 114 are basically double decode circuits. Thus circuit 112 is comprised of two decoder transistors 123 and 124 both having their sources grounded and their drains coupled through a load transistor 122 to a voltage source 110 and to the gate of a source follower transistor 125 whose source is connected to the voltage 110 and whose drain is connected to the output line 66a. Similarly the transistors 126 and 127 are also decode transistors coupled to the output line 66a. The combination of the two decoders transistors 123, 124, 126 and 127, assure that whenever the output of the latch 111a is high or when the line 66 is not high that the line 66a is held low.

The circuit 113 is substantially the same as circuit 112 except that it is provided with additional decode transistors 134 and 138. Thus circuit 113 has decode transistors 133, 134 and 135 all coupled to the voltage source 110 through the load transistor 132 and to the gate of the source follower transistor 136 whose source is coupled to the voltage source 110 and whose drain is coupled to the source of three additional decode transistors 137, 138 and 139. Transistors 133 and 137 are driven by the output line 115 of the latch while transistors 134 and 138 are driven by line 66. The decode transistors 135 and 139 are driven by line 67 via an inverter signal of the transistor 130 whose source is coupled to the voltage source 110 through the load transistor 131 and whose drain is coupled to ground.

Finally, the third circuit 114 provides an inverted signal of either line 66 or 67 and again comprises a set of decoder circuits.

One of the decoder circuits comprises transistors 141, 142 and 143, having their drains coupled to ground and their sources coupled to the voltage source 110 through a load transistor 140 and to the gate of a source follower transistor 144 whose source in turn coupled to the voltage source 110 and whose drain is coupled to the output line 149. Also coupled to the output line 149 are the other decode circuits comprising three decode transistors 145, 146 and 147. The drains of these transistors are coupled to ground and their sources are coupled to line 149. The gates of transistors 141 and 145 are coupled to the latch output line 115 while the gates of transistors 142 and 146 are coupled to line 66 and the gates of transistors 143 and 147 are coupled to line 67. This assures that whenever the gate line 115 or lines 66 or 67 are high, that the output line 149 is held low.

The output signals on lines 66a, 67a and 149 are used to drive the inhibit and copy circuits associated with read head 23 so that these heads will selectively copy the information on a low order bit line whenever that bit line and a higher order bit line are simultaneously addressed.

Figure 6A:
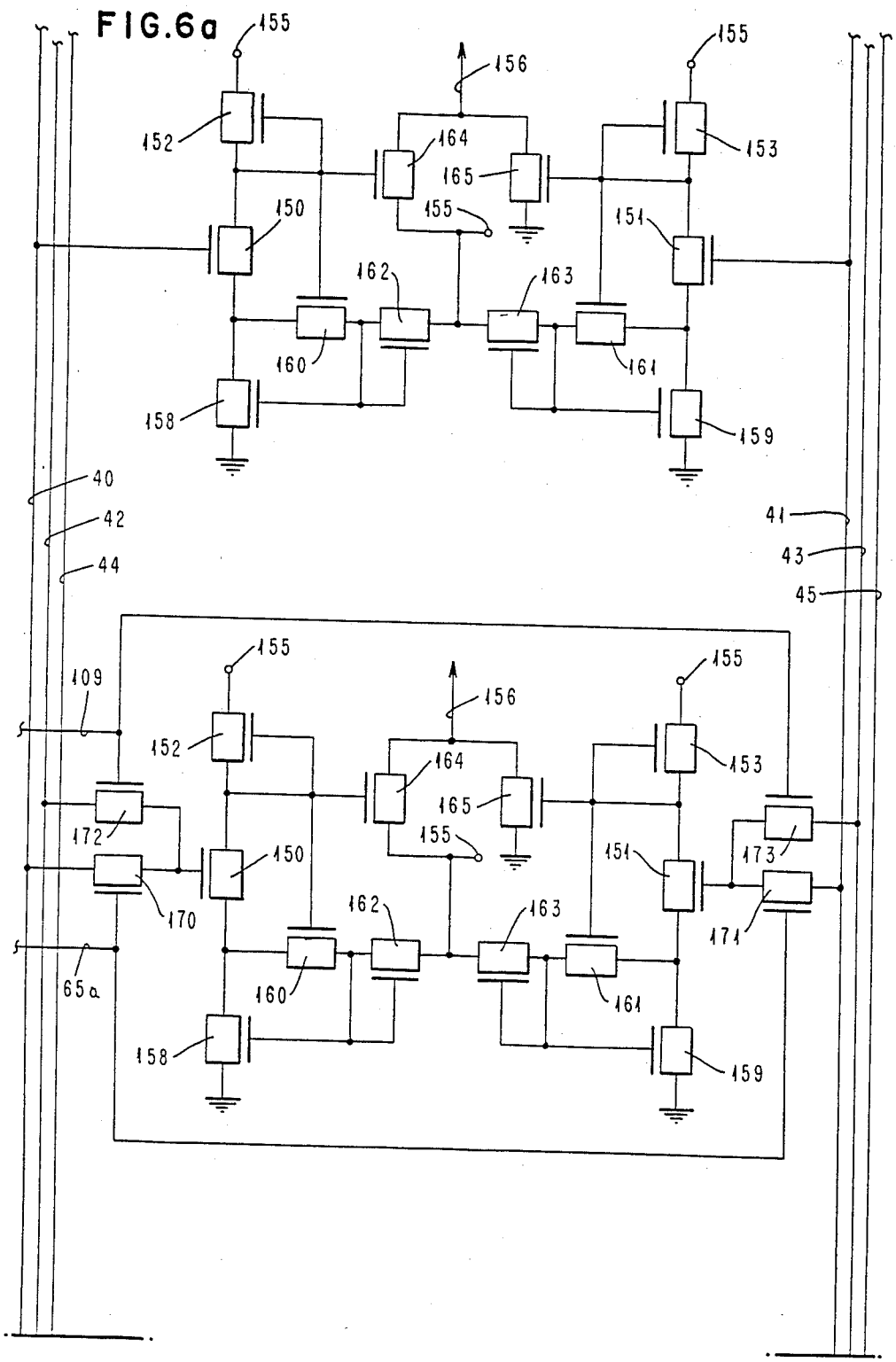

Turning now to FIGS. 6a and 6b, the read head 21 and read heads 22 and 23 and their associated inhibit and copy circuits, suitable for use in the invention, will be described in detail.

Read head 21 basically is a differential sense amplifier and comprises a pair of bit line read transistors 150 and 151 whose gates are coupled to differential bit lines 40 and 41 respectively. The sources of both transistors 150 and 151 are respectively coupled through load transistors 152 and 153 to a voltage source 155. The drains of transistors 150 and 151 are also both coupled through switching transistors 158 and 159 to ground.

The sources of these transistors 150 and 151 are also respectively coupled to the gates of read line switching transistors 164 and 165 and to the gates of inverting source follower transistors 160 and 161. The drains of these follower transistors 160 and 161 are also coupled respectively to the drains of the bit line transistors 150 and 151. The sources of the follower transistors 160 and 161 are coupled through respective load transistors 162 and 163 to the voltage source 155. The drain of read line switching transistor 164 is coupled to the voltage source 155 while the drain of read line switching transistor 165 is coupled to ground. The sources of both read line switching transistors are coupled together into the output read line 156.

As noted previously when the first address and decoder turns on any differential signal in the cell appears on the bit line pair 40 and 41 respectively. Such a differential signal activates the sense amplifier by turning on one of the other read switching transistors 164 or 165 causing the line 156 to emit either a positive or negative signal.

For example, if bit line 40 is positive and bit line 41 is negative upon activation of the cell then transistor 150 turns on and transistor 151 turns off. When device 150 turns on the gate of transistor 164 is pulled down through transistors 150 and 158 causing transistor 164 to turn off. Simultaneously when transistor 151 turns off the gate voltage of transistor 165 rises toward the voltage source 155 through transistor 153 and transistor 165 turns on bringing line 156 low, i.e., towards ground.

If the signals on the bit lines 40 and 41 were reversed, i.e., line 40 were negative and line 41 were positive then the output 156 would be pulled high through transistor 164.

Read heads 22 and 23 are similar and contain sense amplifiers identical to the one in read head 21 but also include inhibit and copy circuits.

Those transistors in read heads 22 and 23 identical in function to those in read head 21 are labeled with identical numbers, i.e., the sense amplifer of each head is identical and labeled with identical numbers.

Read head 22 differs from read head 21 in that it also has in addition to the sense amplifier above described an inhibit and copy circuit coupled to the gates of transistors 150 and 151 of the sense amplifier. The gates of bit line read transistors 150 and 151 are each coupled to the bit lines 40 and 41 respectively through first and second coupling transistors 170 and 171 and to bit line pairs 42 and 43 through second and third coupling transistors 172 and 173.

The gates of coupling transistors 170 and 171 are coupled to line 65a leading from buffer comparator circuit 15 and the gates of transistors 172 and 173 are coupled to line 109 leading from the same buffer circuit 15. Thus, transistors 170, 171, 172 and 173 form the inhibit and copy circuit of the read head 22.

When the address sets P1 and P2 are different then line 65 is low since comparator circuit 24 is off and line 65a is also low while line 109 is high as above described in conjunction with FIG. 4. In this case transistors 170 and 171 are both off preventing signals from bit lines 41 and 42 from reaching the sense amplifier and transistors 172 and 173 are both on coupling the sense amplifier circuit of read head 22 to the bit line pairs 42 and 43. Thus, in this case when the addresses do not compare the read head 22 operates to sense the second bit line pairs 42 and 43.

However, when the address sets P1 and P2 are identical then the comparator circuit 24 acts to send line 65 high causing line 65a to go high via buffer circuit 15 causing transistors 170 and 171 to turn on, conductively coupling the sense amplifier portion of read head 22 to bit lines 40 and 41. Simultaneously the line 109 is pulled down causing the gates of transistors 172 and 173 to also be pulled down so that these devices turn off and actively cut off the sense amplifier of read head 22 from the bit lines 42 and 43. When the transistors 170 and 171 turn on due to the signal received on line 65a the output of the read head 22 copies, i.e., is identical to the output of read head 21.

Read head 23 differs further from both read heads 21 and 22 in that each bit line read transistors 120 and 151 of the sense amplifier is respectively coupled to each pair of bit lines by three coupling transistors. Thus, transistor 150 of the sense amplifier and read head 23 is coupled to bit line 40 via transistor 180 to bit line 42 via transistor 182 and to bit line 44 via transistor 184. Similarly transistor 151 is coupled to bit line 41 via transistor 181 to bit line 43 via transistor 183 and to bit line 45 via transistor 185.

The gates of transistors 180 and 181 are coupled to bit line 66a while the gates of transistors 182 and 183 are coupled to the line 67a and finally the gates of transistors 184 and 185 are coupled to line 149, all leading from buffer circuit 16.

Transistors 180, 181, 182, 183, 184 and 185 form the inhibit and copy circuit of read head 23.

When the address sets P1, P2 and P3 are all different lines 66a and 67a are low since comparator circuits 25 and 26 and buffer circuit 16 are off, and line 149 leading from the buffer circuit 15 is high. In this case transistors 180, 181, 182 and 183 are all normally off and signal from bit line pairs 40 and 41 and 42 and 43 are prevented from reaching the sense amplifier of the read head 23.

Because line 149 is high the sense amplifier circuit of the read head is conductively connected to bit line pairs 44 and 45 through transistors 184 and 185. Thus in this case the read head 23 operates to sense the bit line pairs 44 and 45 only.

However, when the address sets P1 and P3 are the same then the comparator circuit 25 and buffer circuit 16 is active, line 66a goes high causing transistors 180 and 181 to turn on conductively coupling the sense amplifier head 23 to bit lines 40 and 41. Simultaneously of course, the buffer circuit 16 pulls line 149 down causing transistors 184 and 185 to turn off, electrically cutting off the sense amplifier read head 23 from the bit line pairs 44 and 45. Thus, when a comparison between addresses P1 and P3 occurs the output of the sense amplifier read head effectively copies, i.e., is identical to the output of read head 21.

Similarly when the address sets P2 and P3 are identical the read head 23 copies the information being read by the read head 22. In this case the line 67 from comparator circuit 26 goes high turning on the coupling transistors 182 and 183 thus conductively coupling the sense amplifier of head 23 to bit line pair 42 and 43. Simultaneously the buffer circuit 16 is activated and line 149 is pulled down causing transistors 184 and 185 to turn off thus electrically cutting off the sense amplifier of head 23 of bit lines 44 and 45.

It must of course be remembered that lines 66 and 66a are in this case both off and that the transistors 180 and 181 are also off thus electrically disconnecting bit lines 40 and 41 from the sense amplifier of read head 23.

When all three address sets, P1, P2 and P3 all compare both lines 66 and 67 rise while both lines 109 and 149 fall. As noted above when line 66 rises and line 109 falls read head 22 copies the information on bit lines 40 and 41.

In read head 23 however, when both lines 66 and 67 rise together all the transistors 180, 181, 182 and 183 all try to turn on simultaneously. Because lines 149 falls transistors 184 and 185, of course, turn off. If all the transistors 180, 181, 182 and 183 turned on simultaneously the sense amplifier of read head 23 would be trying to read both sets of bit lines 40 and 41 and 42 and 43. To prevent this the additional transistors 134 and 138 in circuit 16 are coupled between lines 66 and 67 and operates as described above. Now when both lines 66 and 67 turn on line 67a becomes coupled to ground through these transistors and the transistors 182 and 183 are prevented from turning on. Thus, the read head 23 becomes electrically connected only to bit lines 40 and 41.

In multi-port systems of more than three ports, the designer must insure that at no time is there more than one bit line coupling device on each side turned on at any given time. The existence and impact of such conditions should now be obvious.

The above described technique has a number of unique advantages not realized by the prior art. By electrically cutting off the differential bit line pairs from the sense amplifier of the read head, in this manner, at no time are the unread bit line pairs grounded. This means that during restore, following reading of the selected bit lines only the selected bit line would have to be restored. This cuts the capacitive restore load to one quarter of the previous load and reduces the restore time to one quarter that known and used by the prior art. This also reduces the restore power to approximately one quarter that needed by the prior art circuitry.

The advantage in this technique is in the use of a hysteresis type differential sense amplifier. This approach further allows for quicker sensing of differential data, greater noise immunity, and much tighter control over the switching voltage and unity gain point of the sense amplifiers.

Another major benefit is the lack of loading on the sense amplifier output nodes. From the input looking in, each sense amplifier is now identical; the loading is placed on the bit line, whose performance is imperceptibly changed due to its already loaded nature.

Finally, the most important improvement is the uniform performance of all three sense amplifiers. Because the signals from the comparators are to be generated before data becomes valid, all three sense amplifiers receive the correct, multiplexed data simultaneously, eliminating the cascading delay encountered in the prior art.

It should, of course, be obvious to one skilled in the art that although the preferred embodiment has been described as having differential bit line pairs that a single ended bit line arrangement could be readily used and that adaptation in the read heads and inhibit and transfer circuits would be made to accommodate such single ended bit line arrays can be readily accomplished.

It should also be noted that although a three-port arrangement has been described that the technique disclosed herein can be extended to any number of ports in excess of three.

Thus, there has been described a technique for accommodating multiple reads in multi-port register arrays which greatly reduces array size and improves performance. Basically the technique as described has been found to show a substantial area decrease in circuitry required and improved reliability of the circuitry.

While the invention has been particularly described with reference to the preferred embodiments thereof, it will be understood by those skilled in the art that changes in form and details can be made in the foregoing preferred embodiments without departing from the spirit and scope of the inventon.

What is claimed is:

1. A buffer circuit comprising:
   a plurality of decode transistors coupled in parallel and coupled to a first input means and coupled to a common output node,
   a clocked latch coupled to clocked inputs and having an output node coupled to one of said decode transistors,
   an inverter circuit coupled to said common output node coupled to said decode transistors, and
   a repeater circuit coupled to said common output node coupled to said decode transistors,
   said inverter circuit and said repeater circuit co-acting with a follower circuit comprising a follower transistor and a load transistor coupled between a voltage source and ground and coupled to said common output node coupled to said decode transistors.

2. The circuit of claim 1 wherein an input signal drives one of said decode transistors and said inverter circuit provides an output inverse to said input signal and said repeater circuit provides an output having the same phase as said input signal.

3. The circuit of claim 1 wherein said clocked latch comprises a pair of cross coupled transistors each of which is in parallel with a respective switching transistor, and in series with a respective load transistor and a voltage source and ground.

4. The circuit of claim 3 wherein each of said switching transistors has a control electrode and said latch circuit has two clock inputs each coupled to the control electrode of a respective one of said switching transistors and to a respective one of said decode transistors.

5. A buffer circuit comprising:
   a clocked latch having clocked inputs and an output,
   a first decode circuit having an output being coupled to first input means, to said clocked inputs and said output of said clocked latch,
   said first decode circuit having an output coupled to a plurality of double decode circuits, and
   a plurality of inverter circuits being coupled to said double decode circuits, said plurality of inverter circuits being one less than the number of double decode circuits.

6. The circuit of claim 5 wherein each of said double decode circuits comprises a second and a third decode circuit, and said second decode circuit has an output coupled to a load transistor and a voltage source and coupled to a follower transistor coupled to a respective output line together with said third decode circuit.

7. The circuit of claim 6 wherein said second and third decode circuits are each comprised of a plurality of decode transistors coupled to a respective signal input.

8. The circuit of claim 7 where at least one decode transistor of each decode circuit of at least one of said double decode circuits is coupled to the output of an inverter circuit.

9. A clocked latch circuit comprising:
   a pair of cross coupled transistors,
   each of said cross coupled transistors being connected to ground and through a respective load transistor to a voltage source,
   a pair of switching transistors, each switching transistor being coupled in parallel with a respective one of said cross coupled transistors, one of said switching transistors being coupled to control the state of a first decode transistor which is coupled to an output line, and a pair of clock inputs, each of said clock inputs coupled to control the state of a respective one of said switching transistors and coupled to control the state of respective second and third decode transistors coupled to said output line.

* * * * *